(12) United States Patent
Aamir et al.

(10) Patent No.: US 12,306,232 B2
(45) Date of Patent: May 20, 2025

(54) POWER DETECTOR FOR DETECTING RADIO FREQUENCY POWER OUTPUT

(71) Applicant: Apple Inc., Cupertino, CA (US)

(72) Inventors: Syed Ahmed Aamir, Munich (DE); Timo W. Gossmann, Neubiberg (DE)

(73) Assignee: Apple Inc., Cupertino, CA (US)

( * ) Notice: Subject to any disclaimer, the term of this patent is extended or adjusted under 35 U.S.C. 154(b) by 156 days.

(21) Appl. No.: 18/102,646

(22) Filed: Jan. 27, 2023

(65) Prior Publication Data

US 2024/0255559 A1 Aug. 1, 2024

(51) Int. Cl.
*G01R 29/08* (2006.01)
*G01R 19/10* (2006.01)
*H04B 17/10* (2015.01)

(52) U.S. Cl.
CPC ......... *G01R 29/0878* (2013.01); *G01R 19/10* (2013.01); *H04B 17/102* (2015.01)

(58) Field of Classification Search
CPC ... G01R 19/10; G01R 29/0878; H04B 17/102
USPC ....................................................... 324/629
See application file for complete search history.

(56) References Cited

U.S. PATENT DOCUMENTS

| | | | |
|---|---|---|---|
| 6,339,702 B1 | 1/2002 | Izumiyama | |
| 7,280,330 B2* | 10/2007 | Oguzman | H03F 1/52 |
| | | | 361/56 |
| 9,484,977 B2* | 11/2016 | Anderson | H04B 1/44 |
| 2007/0223157 A1* | 9/2007 | Chen | H01L 27/0255 |
| | | | 361/56 |
| 2009/0066439 A1* | 3/2009 | Whelan | H03H 7/38 |
| | | | 333/32 |
| 2012/0170161 A1 | 7/2012 | Lin et al. | |
| 2023/0283113 A1* | 9/2023 | Seki | H02J 50/27 |
| | | | 307/104 |

FOREIGN PATENT DOCUMENTS

| | | | | |
|---|---|---|---|---|
| CN | 114152803 A | * | 3/2022 | ........... G01R 21/133 |
| CN | 114512475 A | * | 5/2022 | ......... H01L 27/0248 |

OTHER PUBLICATIONS

O'Sullivan; "Replacing Discrete Protection Components with Overvoltage Fault Protected Analog Switches"; Jun. 27, 2016; Web page <https://www.arrow.com/en/research-and-events/articles/replacing-discrete-protection-components-with-overvoltage-fault-protected-analog-switches> (Year: 2016).*
Zhou et al.; Translation of CN114152803A; Mar. 8, 2022; Translation by EPO & Google (Year: 2022).*
Zhang et al.; Translation of CN 114512475A; May 17, 2022; Translation by EPO & Google (Year: 2022).*
Eamon Nash et al., "An Integrated Bidirectional Bridge with Dual RMS Detectors for RF Power and Return-Loss Measurement", Analog Dialogue, vol. 52, May 2018, pp. 1-20.

(Continued)

*Primary Examiner* — Eman A Alkafawi
*Assistant Examiner* — Rahul Maini
(74) *Attorney, Agent, or Firm* — FLETCHER YODER PC

(57) ABSTRACT

A power detector for measuring the radio frequency (RF) power of RF signals generated by a transmitter or a power amplifier of a transmitter is connected between two diodes of electrostatic discharge (ESD) circuitry that is connected to a signal pathway utilized to transmit the RF signals.

20 Claims, 3 Drawing Sheets

(56) References Cited

OTHER PUBLICATIONS

Robert G. Meyer, "Low-Power Monolithic RF Peak Detector Analysis", IEEE Journal of Solid-State Circuits, vol. 30, No. 1, Jan. 1995, pp. 65-67.
Stacy Ho, "A 450MHZ CMOS RF Power Detector", Analog Devices, Inc., 2001 IEEE Radio Frequency Integrated Circuits Symposium, TUE3F-2, pp. 209-212.
Sang-Min Yoo et al., "A Switched-Capacitor RF Power Amplifier", IEEE Journal of Solid-State Circuits, vol. 46, No. 12, Dec. 2011, pp. 2977-2987.

* cited by examiner

POWER DETECTOR FOR DETECTING RADIO FREQUENCY POWER OUTPUT

BACKGROUND

The present disclosure relates generally to wireless communication, and more specifically to detecting radio frequency (RF) power output by a transmitter.

In an electronic device, a transmitter may output an RF signal that may be transmitted to other devices via an antenna that converts the RF signal into electromagnetic radiation (e.g., radio waves). Measuring the power of the output of the transmitted signal may be useful, for example, to help calibrate the transmitter or adjust an output of a power amplifier that may amplify the RF signal. For instance, a sensing element may be employed to generate a current or voltage that is proportional to the RF signal power. However, in some cases, there may be power loss caused by the sensing device, thereby potentially lowering the accuracy of the signals generated by the sensing device.

SUMMARY

A summary of certain embodiments disclosed herein is set forth below. It should be understood that these aspects are presented merely to provide the reader with a brief summary of these certain embodiments and that these aspects are not intended to limit the scope of this disclosure. Indeed, this disclosure may encompass a variety of aspects that may not be set forth below.

In one embodiment, an electronic device includes a transmitter and an antenna that is coupled to the transmitter. Additionally, the electronic device includes electrostatic discharge (ESD) circuitry communicatively coupled between the transmitter and the antenna. The ESD circuitry includes a plurality of diodes communicably coupled to a voltage supply and ground. Furthermore, the electronic device includes a power detector that is coupled to the ESD circuitry between a first diode of the plurality of diodes and a second diode of the plurality of diodes. The power detector is configured to detect a voltage or current of the RF signal.

In another embodiment, wireless transmission circuitry includes a transmitter configured to transmit a RF signal. The wireless transmission circuitry also includes an antenna that is coupled to the transmitter and configured to receive the RF signal. Moreover, the wireless transmission circuitry also includes a matching network coupled between the transmitter and the antenna. Additionally, the wireless transmission circuitry includes ESD circuitry communicatively coupled between the matching network and the antenna. The ESD circuitry includes a plurality of diodes communicably coupled to a voltage supply and ground. Furthermore, the wireless transmission circuitry includes a power detector that is coupled to the ESD circuitry between a first diode of the plurality of diodes and a second diode of the plurality of diodes. The power detector is configured to detect a voltage or current of the RF signal.

In yet another embodiment, a power detector that is configured to be coupled to ESD circuitry between a first diode of the ESD circuitry and a second diode of the ESD circuitry includes a capacitor configured to receive electrical current from the ESD circuitry. The power detector also includes clamp circuitry that is coupled to the capacitor and configured to generate a biased current by adding direct current (DC) bias to a current received from the capacitor. Additionally, the power detector includes rectifying circuitry coupled to the clamp circuitry. The rectifying circuitry is configured to receive the biased current from the clamp circuitry and to generate a DC electrical current from the biased current. Furthermore, the power detector includes a switch disposed between the clamp circuitry and the rectifying circuitry. The switch is configurable to prevent the rectifying circuitry from receiving the biased current from the clamp circuitry.

Various refinements of the features noted above may exist in relation to various aspects of the present disclosure. Further features may also be incorporated in these various aspects as well. These refinements and additional features may exist individually or in any combination. For instance, various features discussed below in relation to one or more of the illustrated embodiments may be incorporated into any of the above-described aspects of the present disclosure alone or in any combination. The brief summary presented above is intended only to familiarize the reader with certain aspects and contexts of embodiments of the present disclosure without limitation to the claimed subject matter.

BRIEF DESCRIPTION OF THE DRAWINGS

Various aspects of this disclosure may be better understood upon reading the following detailed description and upon reference to the drawings described below in which like numerals refer to like parts.

DETAILED DESCRIPTION OF SPECIFIC EMBODIMENTS

Figure 1:
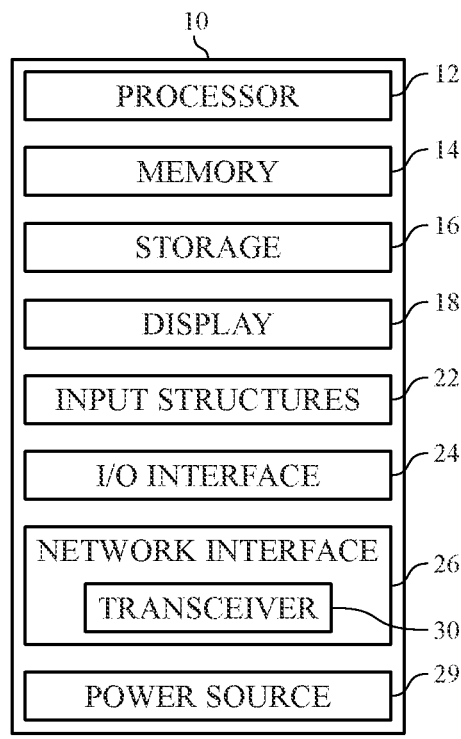
FIG. 1 is a block diagram of an electronic device, according to embodiments of the present disclosure.

When introducing elements of various embodiments of the present disclosure, the articles "a," "an," and "the" are intended to mean that there are one or more of the elements. The terms "comprising," "including," and "having" are intended to be inclusive and mean that there may be additional elements other than the listed elements. Additionally, it should be understood that references to "one embodiment" or "an embodiment" of the present disclosure are not intended to be interpreted as excluding the existence of additional embodiments that also incorporate the recited features. Furthermore, the particular features, structures, or characteristics may be combined in any suitable manner in one or more embodiments. Use of the terms "approximately," "near," "about," "close to," and/or "substantially" should be understood to mean including close to a target (e.g., design, value, amount), such as within a margin of any suitable or contemplatable error (e.g., within 0.1% of a target, within 1% of a target, within 5% of a target, within 10% of a target, within 25% of a target, and so on). Moreover, it should be understood that any exact values, numbers, measurements, and so on, provided herein, are contemplated to include approximations (e.g., within a margin of suitable or contemplatable error) of the exact values, numbers, measurements, and so on. Additionally, the term "set" may include one or more. That is, a set may include a unitary set of one member, but the set may also include a set of multiple members.

This disclosure is directed to the detection of radio frequency (RF) signal power of signals generated by transmitters in wireless communication devices. In electronic devices, a transmitter may output a RF signal that may be transmitted to other devices via an antenna that converts the RF signal into electromagnetic radiation (e.g., radio waves). Measuring the power of the output of the transmitted signal may be useful, for example, to help calibrate the transmitter or adjust an output of a power amplifier that may amplify the RF signal. For instance, a sensing element (e.g., power detector) may be employed to generate a current or voltage that is proportional to the RF signal power. In some cases, the power detector may directly tap the RF signal that is output. However, by doing so, the power detector may cause loading. In other words, the power detector may draw power from the RF signal, meaning there may be power loss caused by the sensing device. This power loss may result in the signals generated by the sensing device being inaccurate, which could therefore lead to improper calibration of the transmitter or the output of the power amplifier to be adjusted in an undesired manner.

Embodiments herein provide techniques to measure RF signal power without introducing loading. That is, the techniques described herein enable RF signal power to be measured in a manner that reduces, minimizes, or eliminates power drawn by the power detector, thereby increasing the accuracy of the output of the power detector. In particular, the present disclosure describes a placement of the power detector within wireless transmission circuitry that may be included in an electronic device as well as an embodiment of the power detector. As described below, rather than directly tapping the RF output, the power detector may be coupled to electrostatic discharge (ESD) circuitry that is coupled to the RF output (e.g. in series) between two diodes of the ESD circuitry. By doing so, the power detector may accurately measure the RF signal power, thereby enabling the electronic device, processing circuitry of the electronic device, or control circuitry of the electronic device to better perform a variety of functions utilizing the accurate output of the power detector.

FIG. 1 is a block diagram of an electronic device 10, according to embodiments of the present disclosure. The electronic device 10 may include, among other things, one or more processors 12 (collectively referred to herein as a single processor for convenience, which may be implemented in any suitable form of processing circuitry), memory 14, nonvolatile storage 16, a display 18, input structures 22, an input/output (I/O) interface 24, a network interface 26, and a power source 29. The various functional blocks shown in FIG. 1 may include hardware elements (including circuitry), software elements (including machine-executable instructions) or a combination of both hardware and software elements (which may be referred to as logic). The processor 12, memory 14, the nonvolatile storage 16, the display 18, the input structures 22, the input/output (I/O) interface 24, the network interface 26, and/or the power source 29 may each be communicatively coupled directly or indirectly (e.g., through or via another component, a communication bus, a network) to one another to transmit and/or receive signals between one another. It should be noted that FIG. 1 is merely one example of a particular implementation and is intended to illustrate the types of components that may be present in the electronic device 10.

By way of example, the electronic device 10 may include any suitable computing device, including a desktop or notebook computer (e.g., in the form of a MacBook®, MacBook® Pro, MacBook Air®, iMac®, Mac® mini, or Mac Pro® available from Apple Inc. of Cupertino, California), a portable electronic or handheld electronic device such as a wireless electronic device or smartphone (e.g., in the form of a model of an iPhone® available from Apple Inc. of Cupertino, California), a tablet (e.g., in the form of a model of an iPad® available from Apple Inc. of Cupertino, California), a wearable electronic device (e.g., in the form of an Apple Watch® by Apple Inc. of Cupertino, California), and other similar devices. It should be noted that the processor 12 and other related items in FIG. 1 may be embodied wholly or in part as software, hardware, or both. Furthermore, the processor 12 and other related items in FIG. 1 may be a single contained processing module or may be incorporated wholly or partially within any of the other elements within the electronic device 10. The processor 12 may be implemented with any combination of general-purpose microprocessors, microcontrollers, digital signal processors (DSPs), field programmable gate array (FPGAs), programmable logic devices (PLDs), controllers, state machines, gated logic, discrete hardware components, dedicated hardware finite state machines, or any other suitable entities that may perform calculations or other manipulations of information. The processors 12 may include one or more application processors, one or more baseband processors, or both, and perform the various functions described herein.

In the electronic device 10 of FIG. 1, the processor 12 may be operably coupled with a memory 14 and a nonvolatile storage 16 to perform various algorithms. Such programs or instructions executed by the processor 12 may be stored in any suitable article of manufacture that includes one or more tangible, computer-readable media. The tangible, computer-readable media may include the memory 14 and/or the nonvolatile storage 16, individually or collectively, to store the instructions or routines. The memory 14 and the nonvolatile storage 16 may include any suitable articles of manufacture for storing data and executable instructions, such as random-access memory, read-only memory, rewritable flash memory, hard drives, and optical discs. In addition, programs (e.g., an operating system) encoded on such a computer program product may also include instructions that may be executed by the processor 12 to enable the electronic device 10 to provide various functionalities.

In certain embodiments, the display 18 may facilitate users to view images generated on the electronic device 10. In some embodiments, the display 18 may include a touch screen, which may facilitate user interaction with a user interface of the electronic device 10. Furthermore, it should be appreciated that, in some embodiments, the display 18 may include one or more liquid crystal displays (LCDs), light-emitting diode (LED) displays, organic light-emitting diode (OLED) displays, active-matrix organic light-emitting diode (AMOLED) displays, or some combination of these and/or other display technologies.

The input structures 22 of the electronic device 10 may enable a user to interact with the electronic device 10 (e.g., pressing a button to increase or decrease a volume level). The I/O interface 24 may enable electronic device 10 to interface with various other electronic devices, as may the network interface 26. In some embodiments, the I/O interface 24 may include an I/O port for a hardwired connection for charging and/or content manipulation using a standard connector and protocol, such as the Lightning connector provided by Apple Inc. of Cupertino, California, a universal serial bus (USB), or other similar connector and protocol. The network interface 26 may include, for example, one or more interfaces for a personal area network (PAN), such as an ultra-wideband (UWB) or a BLUETOOTH® network, a local area network (LAN) or wireless local area network (WLAN), such as a network employing one of the IEEE 802.11x family of protocols (e.g., WI-FI®), and/or a wide area network (WAN), such as any standards related to the Third Generation Partnership Project (3GPP), including, for example, a $3^{rd}$ generation (3G) cellular network, universal mobile telecommunication system (UMTS), $4^{th}$ generation (4G) cellular network, Long Term Evolution (LTE®) cellular network, Long Term Evolution License Assisted Access (LTE-LAA) cellular network, $5^{th}$ generation (5G) cellular network, and/or New Radio (NR) cellular network, a $6^{th}$ generation (6G) or greater than 6G cellular network, a satellite network, a non-terrestrial network, and so on. In particular, the network interface 26 may include, for example, one or more interfaces for using a cellular communication standard of the 5G specifications that include the millimeter wave (mmWave) frequency range (e.g., 24.25-300 gigahertz (GHz)) that defines and/or enables frequency ranges used for wireless communication. The network interface 26 of the electronic device 10 may allow communication over the aforementioned networks (e.g., 5G, Wi-Fi, LTE-LAA, and so forth).

The network interface 26 may also include one or more interfaces for, for example, broadband fixed wireless access networks (e.g., WIMAX®), mobile broadband Wireless networks (mobile WIMAX®), asynchronous digital subscriber lines (e.g., ADSL, VDSL), digital video broadcasting-terrestrial (DVB-T®) network and its extension DVB Handheld (DVB-H®) network, ultra-wideband (UWB) network, alternating current (AC) power lines, and so forth.

As illustrated, the network interface 26 may include a transceiver 30. In some embodiments, all or portions of the transceiver 30 may be disposed within the processor 12. The transceiver 30 may support transmission and receipt of various wireless signals via one or more antennas, and thus may include a transmitter and a receiver. The power source 29 of the electronic device 10 may include any suitable source of power, such as a rechargeable lithium polymer (Li-poly) battery and/or an alternating current (AC) power converter.

Figure 2:
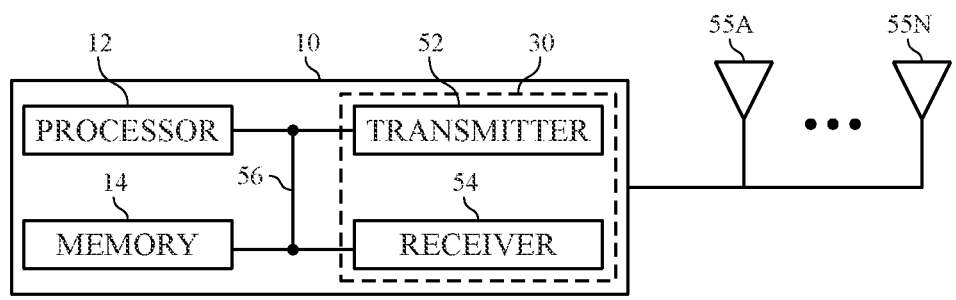
FIG. 2 is a functional diagram of the electronic device of FIG. 1 including a transmitter, according to embodiments of the present disclosure.

FIG. 2 is a functional diagram of the electronic device 10 of FIG. 1, according to embodiments of the present disclosure. As illustrated, the processor 12, the memory 14, the transceiver 30, a transmitter 52, a receiver 54, and/or antennas 55 (illustrated as 55A-55N, collectively referred to as an antenna 55) may be communicatively coupled directly or indirectly (e.g., through or via another component, a communication bus, a network) to one another to transmit and/or receive signals between one another.

The electronic device 10 may include the transmitter (e.g., transmission circuitry) 52 and/or the receiver 54 that respectively enable transmission and reception of signals between the electronic device 10 and an external device via, for example, a network (e.g., including base stations or access points) or a direct connection. As illustrated, the transmitter 52 and the receiver 54 may be combined into the transceiver 30. The electronic device 10 may also have one or more antennas 55A-55N electrically coupled to the transceiver 30. The antennas 55A-55N may be configured in an omnidirectional or directional configuration, in a single-beam, dual-beam, or multi-beam arrangement, and so on. Each antenna 55 may be associated with one or more beams and various configurations. In some embodiments, multiple antennas of the antennas 55A-55N of an antenna group or module may be communicatively coupled to a respective transceiver 30 and each emit radio frequency signals that may constructively and/or destructively combine to form a beam. The electronic device 10 may include multiple transmitters, multiple receivers, multiple transceivers, and/or multiple antennas as suitable for various communication standards. In some embodiments, the transmitter 52 and the receiver 54 may transmit and receive information via other wired or wireline systems or means.

As illustrated, the various components of the electronic device 10 may be coupled together by a bus system 56. The bus system 56 may include a data bus, for example, as well as a power bus, a control signal bus, and a status signal bus, in addition to the data bus. The components of the electronic device 10 may be coupled together or accept or provide inputs to each other using some other mechanism.

Figure 3:
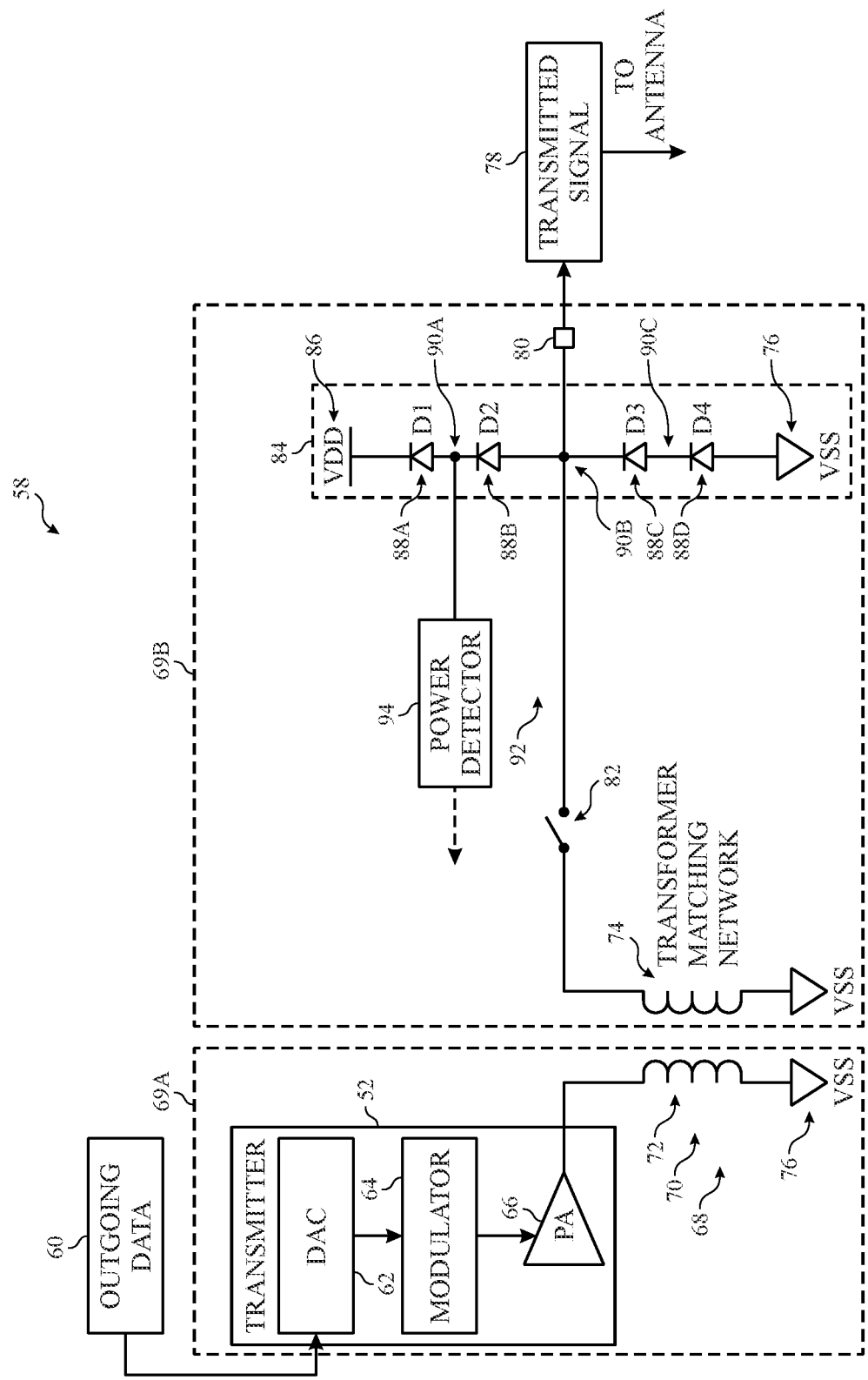
FIG. 3 is a schematic diagram of wireless transmission circuitry that may be included in the electronic device of FIG. 1 and include the transmitter of FIG. 2 and a power detector, according to embodiments of the present disclosure.

FIG. 3 is a schematic diagram of wireless transmission circuitry 58 that may be included in the electronic device 10, according to embodiments of the present disclosure. More specifically, wireless transmission circuitry 58 may be partially included in the transceiver 30 of the electronic device 10 or include the transceiver 30, and, as illustrated, include the transmitter 52. The transmitter 52 may receive outgoing data 60 in the form of a digital signal to be transmitted via the one or more antennas 55. A digital-to-analog converter (DAC) 62 of the transmitter 52 may convert the digital signal to an analog signal, and a modulator 64 may combine the converted analog signal with a carrier signal to generate a radio wave. A power amplifier (PA) 66 receives the modulated signal from the modulator 64. The power amplifier 66 may amplify the modulated signal to a suitable level to drive transmission of the signal via the one or more antennas 55. In some embodiments, the transmitter 52 may include a filter that may then remove undesirable noise from the amplified signal to generate a signal to be transmitted via the one or more antennas 55. Such a filter may include any suitable filter or filters to remove the undesirable noise from the amplified signal, such as a bandpass filter, a bandstop filter, a low pass filter, a high pass filter, and/or a decimation filter. The power amplifier 66 and/or the filter may be referred to as part of a radio frequency front end (RFFE), and more specifically, a transmit front end (TXFE) of the electronic device 10. Additionally, the transmitter 52 may include any suitable additional components not shown, or may not include certain of the illustrated components, such that the transmitter 52 may transmit the outgoing data 60 via the one or more antennas 55. For example, the transmitter 52 may include a mixer and/or a digital up converter.

The wireless transmission circuitry 58 may also include a matching network 68 that transfers electrical energy (e.g., a signal) generated by the power amplifier 66 (e.g., propagated in the form of RF signals) from one portion 69A of the wireless transmission circuitry 58 (e.g., a first portion that includes the transmitter 52) to another portion 69B of the wireless transmission circuitry 58 (e.g., a second portion that includes components that receive electrical signals from the matching network 68). In particular, the matching network 68 may include a transformer 70 that includes a first coil 72 and a second coil 74 that are each connected separately to ground 76 ("VSS"). As electrical current (e.g., output by the power amplifier 66) passes through the first coil 72, electrical current may be generated at the coil 74 due to induction. This resulting current may ultimately be part of or include a transmitted signal 78 that may exit the wireless transmission circuitry 58 via an output (e.g., an RF output)

80 of the wireless transmission circuitry 58 to be transmitted by one or more of the antennas 55. In some embodiments, the matching network 68 may perform filtering operations. Additionally, while the matching network 68 is illustrated as being located external to the transmitter 52, it should be noted that the matching network 68 may be included in the transmitter 52 in other embodiments. Moreover, in some embodiments, the first coil 72 may be connected to a differentially operating circuit. Furthermore, in some embodiments, RF signal processing circuitry, which may include one or more amplifiers (e.g., power amplifiers), may be coupled between the output 80 and the antennas 55 and further process the transmitted signal 78 prior to one or more of the antennas 55 transmitting data.

The wireless transmission circuitry 58, as illustrated, also includes a switch 82. The switch may be closed (e.g., activated) to couple or connect the matching network 68 to the output, thereby enabling the transmitted signal 78 to be transmitted by one or more of the antennas 55. Conversely, the switch 82 may be opened (e.g., deactivated) to prevent signals from reaching and being transmitted by the antennas 55. While the switch 82 is illustrated as being external to the switch 82, it should be noted that the switch 82 may be included in the transmitter 52 in other embodiments.

The wireless transmission circuitry 58 also includes electrostatic discharge (ESD) circuitry 84. The ESD circuitry 84, which may be connected to an output path, wire, or line (e.g., coupling the switch 82 to the output 80) in series, protects other circuitry from electrostatic discharges that may occur within or reach the wireless transmission circuitry 58. In particular, the ESD circuitry 84 may include a voltage source 86 ("VDD"), diodes 88 (referring collectively to diode 88A, diode 88B, diode 88C, diode 88D), and ground 76. The ESD circuitry 84 provides a voltage-divided RF signal at each node 90 (referring collectively to node 90A, 90B, 90C) that is positioned between two of the diodes 88 of the ESD circuitry 84 due to each pair of the diodes 88 acting as capacitors in series. More specifically, a first node 90A couples and is located between a first diode 88A and a second diode 88B of the ESD circuitry 84, a second node 90B couples and is located between the second diode 88B and a third diode 88C of the ESD circuitry 84, and a third node 90C couples and is located between the third diode 88C and a fourth diode 88D of the ESD circuitry 84. While each of the nodes 90 may have or exhibit a voltage-divided RF signal, the first node 90A and the third node 90C may be better isolated from RF pathway 92 (e.g., coupling the switch 82 to the output 80) than the second node 90B because the second node 90B is more directly exposed to RF signals generated by the power amplifier 66. Thus, circuitry connected to the ESD circuitry 84 at the first node 90A or the third node 90C, relative to the second node 90B, may be better protected from relatively higher peak-to-peak signal swings that may occur on the RF pathway 92. Such circuitry may include a power detector 94, which may receive an RF signal present at the first node 90A and generate a signal (e.g., a current or voltage) indicative of the power of the received RF signal. In other words, by coupling the power detector 94 to the ESD circuitry 84 at a node 90 that is between two diodes 88 and isolated from the signal pathway 92 (and the output 80), the power detector 94 may generate signals indicative of the RF power of RF signals transmitted along the RF pathway 92 without directly tapping the output 80 and while being unexposed to the relatively higher peak-to-peak signal swings that may occur on the RF pathway 92. Accordingly, the power detector 94 may be less susceptible to loading that may occur when coupled directly to the RF pathway 92 or the output 80, thereby enabling the power detector 94 to provide more indications of the power of RF signals generated by the power amplifier 66.

Before describing an embodiment of the power detector 94 in more detail, it should be noted that the power detector 94 may be communicatively coupled to the processor 12 or other processing circuitry (e.g., control circuitry) that may be included in the electronic device 10, which may use signals received from the power detector 94 to control the transmitter 52. For example, the processor 12 or other processing circuitry may adjust a level of amplification provided by the power amplifier 66 based on the received output of the power detector 94.

Furthermore, it should also be noted that ESD circuitry 84 may include any suitable number of diodes 88 arranged in any suitable manner such that the power detector 94 is coupled the ESD circuitry 84 between two of the diodes 88 and not directly exposed to the RF pathway 92. In other words, while the illustrated embodiment of the ESD circuitry 84 includes four diodes 88, in other embodiments, the ESD circuitry 84 may include two, three, or more than four diodes 88. For example, in another embodiment, the ESD circuitry 84 may include only the first diode 88A and the second diode 88B, and the power detector 94 may be connected to the ESD circuitry 84 at the first node 90A. In another embodiment, the ESD circuitry 84 may include only the third diode 88C and the fourth diode 88D, and the power detector 94 may be connected to the ESD circuitry 84 at the first node 90A. In yet another embodiment, the ESD circuitry 84 could include three or more diodes 88 positioned between the voltage source 86 and the second node 90B and/or between the second node 90B and the ground 76. In such an embodiment, the power detector 94 could couple or be positioned between any two of the diodes 88 that are located on one side of the second node 90B (e.g., between the voltage source 86 and the second node 90B or between the second node 90B and the ground 76). Furthermore, it should be noted that the diodes 88 of the ESD circuitry 84 may be connected in series, parallel, or a combination thereof. For example, in one embodiment, the ESD circuitry 84 may include a first set of diodes 88 that is coupled to a second set of diodes 88 in series and a third set of diodes in parallel.

Figure 4:
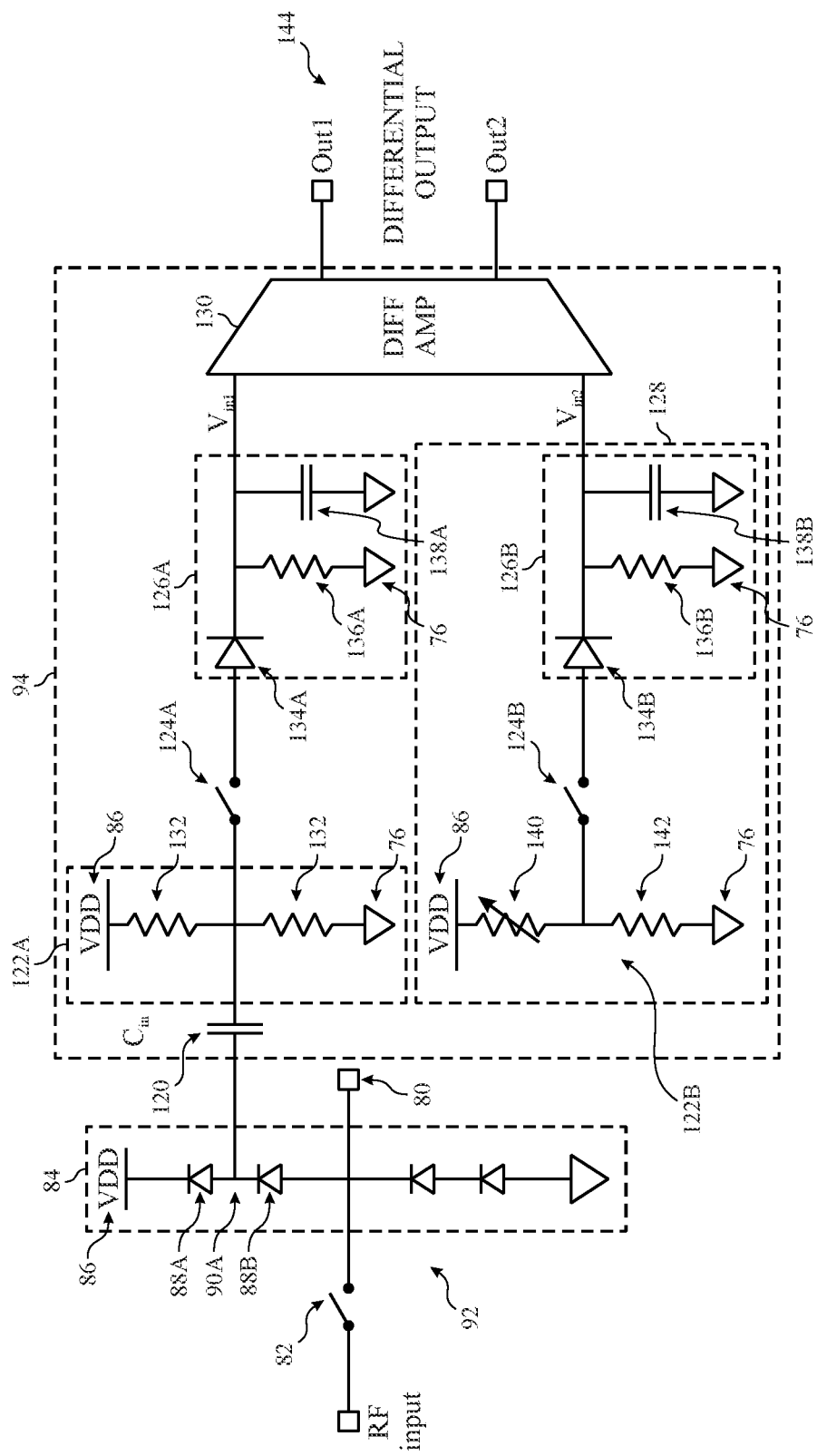
FIG. 4 is a schematic diagram of the power detector of FIG. 3, according to embodiments of the present disclosure.

Continuing with the drawings, FIG. 4 is a schematic diagram of the power detector 94 in accordance with an embodiment of the present disclosure. As illustrated, the power detector 94 includes a capacitor 120 (e.g., an input capacitor $C_{in}$), clamp circuitry 122A, a switch 124A, rectifying circuitry 126A, reference signal circuitry 128 (which may also be referred to as a "reference line"), and a differential amplifier 130. The capacitor 120 may receive an alternating current (AC) signal from the ESD circuitry 84, such as a voltage-divided RF signal present at the first node 90A, and decouple direct current (DC) levels in the signal between pairs of diodes 88 of the ESD circuitry 84. The clamp circuitry 122A may receive electrical current (e.g., AC current) from the capacitor 120 and bias the received current to generate a biased current. More particularly, the clamp circuitry 122A may add a DC bias to the AC electrical current received from the capacitor 120 to generate the biased current (e.g., a DC biased RF signal). As illustrated, the clamp circuitry 122A may include resistors 132 that are coupled to the voltage source 86 and to ground 76. However, in other embodiments, the clamp circuitry 122A may include any circuitry capable of generating a biased current.

The switch 124A, which may be disposed between the clamp circuitry 122A and the rectifying circuitry 126A, is configurable to prevent the biased electrical current output by clamp circuitry 122A from reaching the rectifying circuitry 126A. For example, the processor 12 or control circuitry coupled to the power detector 94 may cause the switch 124A to open to disconnect the clamp circuitry 122A from the rectifying circuitry 126A to prevent the rectifying circuitry 126A from receiving the biased current generated by the clamp circuitry 122A. Conversely, when the switch 124A is closed, the rectifying circuitry 126A receives the biased current from the clamp circuitry 122A.

The rectifying circuitry 126A may receive the biased current from the clamp circuitry 122A and generate a DC electrical current from the biased current. In other words, the rectifying circuitry 126A may convert a received AC electrical current into a DC electrical current that is output to the differential amplifier 130 (as indicated by "$V_{in1}$"). In particular, the rectifying circuitry 126A may operate as a half-wave rectifier and include a diode 134A (e.g., a metal-oxide-semiconductor (MOS) diode) and a resistor-capacitor (RC) circuit that includes a resistor 136A and a capacitor 138A, each of which is connected (directly, without an intervening component) to ground 76. Utilizing a MOS diode for the diode 134A, which may have a lower threshold voltage than other types of diodes, may enable detection of electrical currents in relatively low voltage supply systems (e.g., supply systems providing a current having less than one volt). Additionally, the resistor 136A and capacitor 138A may have an RC time constant ($\tau$, which is equal to the product of the resistance (in ohms) of the resistor 136A and the capacitance (in farads) of the capacitor 138A) that is high enough to enable the rectifying circuitry 126A to generate an output for a particular frequency range or ranges. Thus, the rectifying circuitry 126A may generate a DC current that is proportional to the RF input signal (e.g., as generated by the transmitter 52 or power amplifier 66 and/or as received by the ESD circuitry 84 or power detector 94). Before proceeding to discuss the reference signal circuitry 128, it should be noted that the rectifying circuitry 126A may differ in other embodiments. In other words, the rectifying circuitry 126A of FIG. 4 is one example of rectifying circuitry that may be utilized. In other embodiments, any suitable circuitry capable of converting AC current to DC current may be utilized.

The reference signal circuitry 128 generates a reference electrical current that is provided to the differential amplifier 130 (as indicated by "$V_{in2}$"). The reference signal circuitry 128 includes clamp circuitry 122B, switch 124B, and rectifying circuitry 126B. The reference signal circuitry 128 receives a voltage from the voltage source 86, which may be biased by the clamp circuitry 122B. The clamp circuitry 122B includes a variable resistor 140 and a resistor 142. The resistor 142 may be the same as the resistors 132 of the clamp circuitry 122A, while the variable resistor 140 may be employed to tune any residual offset (e.g., by providing an adjustable amount of electrical resistance).

The switch 124B is configurable to prevent the electrical current output by clamp circuitry 122B from reaching the rectifying circuitry 126B. For example, the processor 12 or control circuitry coupled to the power detector 94 may cause the switch 124B to open to disconnect the clamp circuitry 122B from the rectifying circuitry 126B and prevent the rectifying circuitry 126B from receiving the current generated by the clamp circuitry 122A. Conversely, when the switch 124B is closed, the rectifying circuitry 126B receives electrical current from the clamp circuitry 122B.

The rectifying circuitry 126B may include components similar to those of the rectifying circuitry 126A and function in a similar manner as the rectifying circuitry 126A. For instance, the rectifying circuitry 126B may receive the electrical current from the clamp circuitry 122B and generate a DC electrical current from the received current. The rectifying circuitry 126B may operate as a half-wave rectifier and may include a diode 134B (e.g., a metal-oxide semiconductor (MOS) diode) as well as an RC circuit that includes a resistor 136B and a capacitor 138B, each of which is connected (directly) to ground 76. Similar to the rectifying circuitry 126B, it should be noted that any suitable circuitry capable of converting AC current to DC current may be utilized in other embodiments.

The differential amplifier 130 receives a first electrical signal generated by the rectifying circuitry 126A and a second electrical signal generated by the rectifying circuitry 126B and generates a differential output 144 indicative of the difference in voltage (or, alternatively, the different in electrical current) of the first electrical signal and the second electrical signal. In other words, the differential amplifier 130 may sense the difference in the voltages (or currents (e.g., a value in amperes)) of the first electrical signal and the second electrical signal and generate the differential output 144, which may be indicative of the difference in the voltages (or currents) of the first electrical signal and the second electrical signal. In this manner, the differential output 144 is also indicative of the voltage or current of the RF signal that propagates along the RF pathway 92. Further, while the illustrated embodiment of the differential output 144 is illustrated as having two components (e.g., "Out1" and "Out2"), in other embodiments, the differential amplifier 130 may generate a single output (e.g., an electrical signal indicative of the difference in the voltages (or currents) of the first electrical signal and the second electrical signal) as the differential output 144.

It should be noted that, in other embodiments, the power detector 94 may not include the reference signal circuitry 128. In such embodiments, the power detector 94 may also not include the differential amplifier 130 or generate the differential output 144. Rather, DC electrical current generated by the rectifying circuitry 126A may be the output of the power detector 94. In such embodiments, alternatively to using the DC electrical current as the output, the differential amplifier 130 may be replaced with an amplifier that amplifies the DC electrical current, and the amplified current generated by the amplifier may be the output of the power detector 94. In any case, the output of the power detector 94 may be received by the processor 12 or other processing circuitry (e.g., control circuitry for the transmitter 52) of the electric device 10, which may control the operation of the transmitter 52 or one or more components thereof based on the output received from the power detector 94.

The specific embodiments described above have been shown by way of example, and it should be understood that these embodiments may be susceptible to various modifications and alternative forms. It should be further understood that the claims are not intended to be limited to the particular forms disclosed, but rather to cover all modifications, equivalents, and alternatives falling within the spirit and scope of this disclosure.

The techniques presented and claimed herein are referenced and applied to material objects and concrete examples of a practical nature that demonstrably improve the present technical field and, as such, are not abstract, intangible or purely theoretical. Further, if any claims appended to the end of this specification contain one or more elements designated as "means for [perform]ing [a function] . . . " or "step for [perform]ing [a function] . . . ," it is intended that such elements are to be interpreted under 35 U.S.C. 112(f). However, for any claims containing elements designated in any other manner, it is intended that such elements are not to be interpreted under 35 U.S.C. 112(f).

It is well understood that the use of personally identifiable information should follow privacy policies and practices that are generally recognized as meeting or exceeding industry or governmental requirements for maintaining the privacy of users. In particular, personally identifiable information data should be managed and handled so as to minimize risks of unintentional or unauthorized access or use, and the nature of authorized use should be clearly indicated to users.

The invention claimed is:

1. An electronic device, comprising:
   a transmitter;
   an antenna coupled to the transmitter;
   electrostatic discharge (ESD) circuitry coupled to the transmitter and the antenna at a node, the ESD circuitry comprising a plurality of diodes; and
   a power detector coupled to the ESD circuitry between a first diode of the plurality of diodes and a second diode of the plurality of diodes, the first diode coupled to a voltage supply or ground, and the second diode coupled between the first diode and the node.

2. The electronic device of claim 1, wherein the power detector comprises
   a capacitor configured to receive electrical current from the ESD circuitry,
   clamp circuitry coupled to the capacitor and configured to generate a biased current by adding direct current (DC) bias to a current received from the capacitor, and
   rectifying circuitry coupled to the clamp circuitry, the rectifying circuitry configured to receive the biased current from the clamp circuitry and to generate a DC electrical current from the biased current.

3. The electronic device of claim 2, comprising a reference line coupled to the voltage supply and configured to output a reference electrical current.

4. The electronic device of claim 3, comprising a differential amplifier configured to
   receive the DC electrical current from the rectifying circuitry,
   receive the reference electrical current from the reference line, and
   generate a differential output indicative of a difference between a first voltage of the DC electrical current and a second voltage of the reference electrical current.

5. The electronic device of claim 2, comprising a first switch coupling the clamp circuitry and the rectifying circuitry and configurable to prevent the rectifying circuitry from receiving the biased current from the clamp circuitry.

6. The electronic device of claim 1, wherein the plurality of diodes comprises at least one diode coupled between the node and the ground and at least one diode coupled between the voltage supply and the node.

7. The electronic device of claim 1, comprising a matching network coupled between the transmitter and the ESD circuitry.

8. The electronic device of claim 7, comprising a second switch coupling the matching network and the ESD circuitry, the second switch configurable to prevent the ESD circuitry from receiving electrical current from the matching network.

9. The electronic device of claim 4, wherein the reference line comprises
   a third switch coupling the voltage supply and the differential amplifier, the third switch configurable to prevent the differential amplifier from receiving the reference electrical current,
   a variable resistor coupled between the voltage supply and the third switch, and
   second rectifying circuitry disposed along the reference line between the third switch and the differential amplifier, the second rectifying circuitry configured to generate the reference electrical current.

10. Wireless transmission circuitry, comprising:
    a transmitter configured to transmit a radio frequency (RF) signal;
    an antenna coupled to the transmitter and configured to receive the RF signal;
    a matching network coupled between the transmitter and the antenna;
    electrostatic discharge (ESD) circuitry coupled to the matching network and the antenna at a node, the ESD circuitry comprising a plurality of diodes; and
    a power detector configured to detect a voltage or current of the RF signal, the power detector coupled to the ESD circuitry between a first diode of the plurality of diodes and a second diode of the plurality of diodes, the first diode coupled to a voltage supply or ground, and the second diode coupled between the first diode and the node.

11. The wireless transmission circuitry of claim 10, wherein the power detector comprises
    a capacitor configured to receive electrical current from the ESD circuitry,
    clamp circuitry coupled to the capacitor and configured to generate a biased current by biasing a current received from the capacitor, and
    rectifying circuitry coupled to the clamp circuitry, the rectifying circuitry configured to receive the biased current from the clamp circuitry and to generate a direct current (DC) electrical current from the biased current.

12. The wireless transmission circuitry of claim 11, wherein the rectifying circuitry comprises a metal-oxide-semiconductor (MOS) diode, a resistor, and a capacitor.

13. The wireless transmission circuitry of claim 11, comprising:
    a reference line coupled to the voltage supply and configured to output a reference electrical current; and
    a differential amplifier configured to
    receive the DC electrical current from the rectifying circuitry,
    receive the reference electrical current from the reference line, and
    generate a differential output indicative of a difference between a first voltage of the DC electrical current and a second voltage of the reference electrical current.

14. The wireless transmission circuitry of claim 10, wherein the plurality of diodes comprises three or more diodes.

15. The wireless transmission circuitry of claim 10, comprising a first switch coupling the matching network and the ESD circuitry, the first switch configurable to prevent the ESD circuitry from receiving electrical current from the matching network.

16. The wireless transmission circuitry of claim 11, comprising a second switch coupling the clamp circuitry and the rectifying circuitry and configurable to prevent the rectifying circuitry from receiving the biased current from the clamp circuitry.

17. A power detector, comprising:
a capacitor configured to receive electrical current from electrostatic discharge (ESD) circuitry, the capacitor coupled to a first diode of the ESD circuitry and a second diode of the ESD circuitry, the ESD circuitry coupled to a transmitter and an antenna at a node, the first diode coupled to a voltage supply or ground, and the second diode coupled between the first diode and the node;
clamp circuitry coupled to the capacitor and configured to generate a biased current by adding a direct current (DC) bias to a current received from the capacitor;
rectifying circuitry coupled to the clamp circuitry, the rectifying circuitry configured to receive the biased current from the clamp circuitry and to generate a direct current (DC) electrical current from the biased current; and
a first switch coupling the clamp circuitry and the rectifying circuitry and configurable to prevent the rectifying circuitry from receiving the biased current from the clamp circuitry.

18. The power detector of claim 17, wherein
the clamp circuitry comprises one or more resistors, and
the rectifying circuitry comprises a diode, a resistor, and a second capacitor.

19. The power detector of claim 18, comprising:
a reference line coupled to the voltage supply and configured to output a reference electrical current; and
a differential amplifier configured to
receive the DC electrical current from the rectifying circuitry,
receive the reference electrical current from the reference line, and
generate a differential output indicative of a difference between a first voltage of the DC electrical current and a second voltage of the reference electrical current.

20. The power detector of claim 19, wherein the reference line comprises
a second switch coupling the voltage supply and the differential amplifier, the second switch configurable to prevent the differential amplifier from receiving the reference electrical current,
a variable resistor coupled between the voltage supply and the second switch, and
second rectifying circuitry disposed along the reference line between the second switch and the differential amplifier, the second rectifying circuitry configured to generate the reference electrical current.

* * * * *